United States Patent
Ko et al.

(10) Patent No.: US 9,875,975 B2
(45) Date of Patent: Jan. 23, 2018

(54) SEMICONDUCTOR DEVICE INCLUDING ELECTROSTATIC DISCHARGE CIRCUIT AND OPERATION METHOD THEREOF

(71) Applicant: SAMSUNG ELECTRONICS CO., LTD., Suwon-si, Gyeonggi-Do (KR)

(72) Inventors: Jaehyok Ko, Hwaseong-si (KR); Minchang Ko, Osan-si (KR); Hangu Kim, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 468 days.

(21) Appl. No.: 14/695,418

(22) Filed: Apr. 24, 2015

(65) Prior Publication Data

US 2015/0333508 A1   Nov. 19, 2015

(30) Foreign Application Priority Data

May 14, 2014   (KR) .......................... 10-2014-0057863

(51) Int. Cl.
| | |
|---|---|
| H02H 9/00 | (2006.01) |
| H01L 23/60 | (2006.01) |
| H02H 9/04 | (2006.01) |
| H01L 27/02 | (2006.01) |

(52) U.S. Cl.
CPC .......... *H01L 23/60* (2013.01); *H01L 27/0266* (2013.01); *H02H 9/04* (2013.01); *H02H 9/046* (2013.01); *H01L 2924/0002* (2013.01)

(58) Field of Classification Search
CPC ...................................................... H01L 23/60
USPC .......................................................... 361/56
See application file for complete search history.

(56) References Cited

U.S. PATENT DOCUMENTS

| | | | |
|---|---|---|---|
| 5,218,222 A | 6/1993 | Roberts | |
| 6,356,102 B1* | 3/2002 | Klein | ............... H03K 17/164 326/27 |
| 7,256,976 B2 | 8/2007 | Sato | |
| 7,616,417 B2* | 11/2009 | Yoshida | ............. G01R 31/2879 361/111 |
| 7,859,804 B1 | 12/2010 | Gallerano et al. | |
| 8,194,369 B2 | 6/2012 | Okushima | |
| 8,836,404 B2* | 9/2014 | Vu | ................ H03K 19/017509 327/312 |
| 9,466,972 B2* | 10/2016 | Mallikarjunaswamy | .......................... H03K 17/08104 |
| 2009/0067106 A1 | 3/2009 | Kim | |

(Continued)

FOREIGN PATENT DOCUMENTS

| | | |
|---|---|---|
| JP | 2000-260948 | 9/2000 |
| JP | 2009-187997 | 8/2009 |
| KR | 1019970053847 | 7/1997 |

(Continued)

*Primary Examiner* — Stephen W Jackson

(74) *Attorney, Agent, or Firm* — F. Chau & Associates, LLC

(57) ABSTRACT

A semiconductor device includes a first driver configured to pull up a voltage level of a pad to a first power voltage in response to a driving signal, a second driver configured to pull down the voltage level of the pad to a second power voltage in response to the driving signal, a switch protection resistor configured to change an electrical resistance between the pad and the second driver in response to a switch control signal, and an ESD detector configured to detect a voltage level of the first or second power voltage and generate the switch control signal.

20 Claims, 13 Drawing Sheets

(56) References Cited

U.S. PATENT DOCUMENTS

2010/0149704 A1   6/2010   Moon
2013/0083437 A1   4/2013   Huang

FOREIGN PATENT DOCUMENTS

KR   1020120020230   3/2012
KR   1020120039192   4/2012
KR   1020120094262   8/2012

\* cited by examiner

SEMICONDUCTOR DEVICE INCLUDING ELECTROSTATIC DISCHARGE CIRCUIT AND OPERATION METHOD THEREOF

CROSS-REFERENCE TO RELATED APPLICATIONS

This application claims priority under 35 U.S.C. § 119 to Korean Patent Application No. 10-2014-0057863, filed on May 14, 2014, the disclosure of which is incorporated by reference herein in its entirety.

TECHNICAL FIELD

Exemplary embodiments of the inventive concept relate to a semiconductor device, and more particularly, to a semiconductor device including an electrostatic discharge circuit and an operation method thereof.

DISCUSSION OF THE RELATED ART

Electronic devices such as mobile devices include various semiconductor integrated circuits. As the semiconductor integrated circuits are scaled down, enhanced electrostatic discharge protection becomes more important for the semiconductor integrated circuits. For example, an electrostatic discharge (ESD) circuit is used to protect a semiconductor chip or circuit against static electricity. ESD refers to a discharging phenomenon caused by static electricity. For example, due to static electricity, a voltage higher than a given breakdown voltage of a circuit may be applied between separate portions of the circuit. In this case, the circuit may be broken by a large current caused by such a high electrostatic voltage. For example, in a semiconductor device that includes MOS (metal-oxide-semiconductor) transistors, if the high electrostatic voltage is instantaneously applied to an I/O pad connected to an input or output circuit, a gate insulating layer of the MOS transistor may be damaged or broken by the high electrostatic voltage.

SUMMARY

Exemplary embodiments of the inventive concept provide an electrostatic discharge circuit configured to protect an internal circuit against electrostatic discharge and satisfy a timing requirement, and a semiconductor device including such an electrostatic discharge circuit.

According to an exemplary embodiment of the inventive concept, a semiconductor device may include a first driver configured to pull up a voltage level of a pad to a first power voltage in response to a driving signal, a second driver configured to pull down the voltage level of the pad to a second power voltage in response to the driving signal, a switch protection resistor configured to change an electrical resistance between the pad and the second driver in response to a switch control signal, and an ESD detector configured to detect a voltage level of the first or second power voltage and generate the switch control signal.

According to an exemplary embodiment of the inventive concept, a semiconductor device may include a driver configured to drive a pad with a first power voltage or a second power voltage in accordance with a driving signal, a switch protection resistor configured to form a current path between the pad and the driver, the current path being formed to pass through or bypass a protection resistor in accordance with a switch control signal, and an ESD detector monitoring the first or second power voltage and generating the switch control signal, the switch control signal being generated to form the current path passing through the protection resistor when an ESD event occurs.

According to an exemplary embodiment of the inventive concept, provided is a method of operating an electrostatic discharge circuit of a semiconductor device. The electrostatic discharge circuit may include a pad and a driver driving the pad. The method may include detecting an AC component of a power voltage of the semiconductor device, processing the AC component to generate a switch control signal capable of increasing an electrical resistance between the pad and the driver, when the AC component is elevated over a specific level, and performing a switching operation to connect the pad to the driver through a protection resistor, in accordance with the switch control signal.

According to an exemplary embodiment of the inventive concept, a semiconductor device includes a driver configured to drive a pad with a first power voltage or a second power voltage in accordance with a driving signal, a switch protection resistor configured to form one of a first current path and a second current path between the pad and the driver in accordance with a switch control signal, wherein the first current path passes through a protection resistor and the second current path bypasses the protection resistor, and an electrostatic discharge (ESD) detector configured to monitor the first or second power voltage and generate the switch control signal, wherein the first current path is formed in response to an occurrence of an ESD event.

According to an exemplary embodiment of the inventive concept, a method of operating an electrostatic discharge (ESD) circuit in a semiconductor device includes detecting an alternating current (AC) component of a power voltage of the semiconductor device, processing the AC component to generate a switch control signal that causes a resistance between a pad of the ESD circuit and a driver of the ESD circuit to increase in response to the AC component being higher than a reference value, and performing a switching operation to connect the pad to the driver through a first current path including a protection resistor in accordance with the switch control signal.

According to an exemplary embodiment of the inventive concept, a method of operating an electrostatic discharge (ESD) circuit in a semiconductor device, includes detecting an occurrence of an ESD event, generating a switch control signal that controls a switch protection resistor disposed in the semiconductor device, wherein the switch control signal indicates whether the occurrence of the ESD event has been detected, turning on a switch transistor in the switch protection resistor in response to the switch control signal indicating that the occurrence of the ESD event has not been detected, wherein turning on the switch transistor establishes a first current path between a pad of the semiconductor device and a driver of the semiconductor device, and the first current path includes the switch transistor and does not include a protection resistor, and turning off the switch transistor in the switch protection resistor in response to the switch control signal indicating that the occurrence of the ESD event has been detected, wherein turning off the switch transistor establishes a second current path between the pad of the semiconductor device and the driver of the semiconductor device, and the second current path includes the protection resistor.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
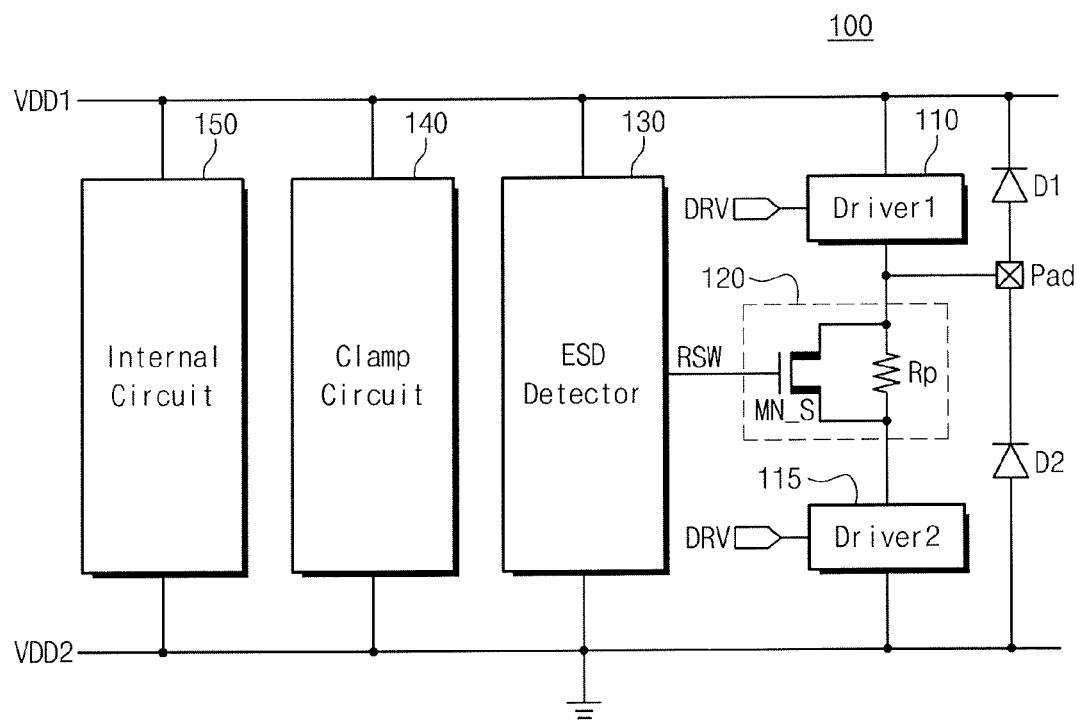
FIG. 1 is a block diagram illustrating a semiconductor device including an electrostatic discharge circuit according to an exemplary embodiment of the inventive concept.

Exemplary embodiments of the present inventive concept will be described more fully hereinafter with reference to the accompanying drawings. Like reference numerals may refer to like elements throughout the drawings. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper", etc., may be used herein for ease of description to describe one element or feature's relationship to another element(s) or feature(s) as illustrated in the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

Herein, when two or more elements or values are described as being substantially the same as each other, it is to be understood that the elements or values are identical to each other, indistinguishable from each other, or distinguishable from each other but functionally the same as each other as would be understood by a person having ordinary skill in the art.

FIG. 1 is a block diagram illustrating a semiconductor device including an electrostatic discharge circuit according to an exemplary embodiment of the inventive concept. Referring to FIG. 1, a semiconductor device 100 may include drivers 110 and 115 configured to transfer driving signals to a pad Pad, a switch protection resistor 120, an ESD (electrostatic discharge) detector 130, a clamp circuit 140, and an internal circuit 150. Herein, the switch protection resistor 120, the ESD detector 130, the clamp circuit 140, and diodes D1 and D2 may constitute at least a part of the electrostatic discharge circuit.

The pad Pad may be connected to the drivers 110 and 115, the switch protection resistor 120, and the diodes D1 and D2. The first diode D1 may be connected between the pad Pad and a first power line, to which a first power voltage VDD1 is applied. The second diode D2 may be connected between the pad Pad and a second power line, to which a second power voltage VDD2 is applied. In an exemplary embodiment, the first power voltage VDD1 may be a positive voltage and the first diode D1 may be in the forward-biased state, and the second power voltage VDD2 may be a ground or negative voltage and the second diode D2 may be in a reverse-biased state.

In a case in which a large amount of positive charges are supplied to the pad Pad, the first diode D1 may be in a forward-biased state, allowing for transmission of the positive charges to the first power line. Thus, the positive charges can be discharged to the second power line via an electrostatic discharge circuit such as, for example, the clamp circuit 140. In a case in which a large amount of negative charges are supplied to the pad Pad, the second diode D2 may be in a forward-biased state, allowing for protection of the internal circuit 150 against an electrostatic event.

The drivers 110 and 115 may be configured to pull up or pull down a voltage level of the pad Pad in response to a driving signal DRV. The structure of each of the drivers 110 and 115 may vary depending on to the manner in which data is transmitted via the pad Pad. For example, in the semiconductor device 100, signal data may be transmitted based on single level signaling (e.g., a CMOS signal) or differential signaling (e.g., a low voltage differential signaling (LVDS)), and each of the drivers 110 and 115 may be configured to have a structure suitable therefor.

In a recent display driver IC (DDI) for driving a high-resolution mobile display, there are increasing demands for low signal level and high noise margin. For example, it is desirable that the DDI be configured to perform signal transmission with a relatively low voltage and improved display characteristics. Accordingly, to improve reliability of transmitted signals, a slew-rate requirement associated with a timing condition of signals may be tightly controlled. That is, a technical requirement associated with a terminal impedance of the pad Pad may be tightly controlled.

The switch protection resistor 120 may be provided between the pad Pad and the second driver 115. The switch protection resistor 120 may vary a resistance property that is adjusted by a switch control signal RSW. The switch protection resistor 120 may include a switch element and a protection resistor Rp. The switch element may include, for example, a high voltage transistor connected in parallel to the protection resistor Rp. Hereinafter, the switch element may be referred to as a "switch transistor". The description that follows will refer to an illustrated example in which the switch transistor MN_S is an NMOS (n-channel metal-oxide-semiconductor) transistor. However, the switch transistor is not limited thereto. For example, in an exemplary embodiment, the switch transistor MN_S may be a PMOS (p-channel metal-oxide-semiconductor) transistor, or may include at least one device capable of serving as a switching element.

The protection resistor Rp may be configured to control an amount of electric current flowing toward the second driver 115 when an ESD event occurs. For example, the protection resistor Rp may restrict an amount of electric current flowing into an NMOS transistor of the second driver 115. A resistance level of the protection resistor Rp may be determined in consideration of a limit or endurable level in current or voltage of the second driver 115.

The ESD detector 130 may be configured to detect an ESD event to be transmitted through the pad Pad and produce a switch control signal RSW for controlling the switch protection resistor 120. In normal operation, the ESD detector 130 may be configured to turn on the switch transistor MN_S of the switch protection resistor 120. That is, when there is no ESD event, a current path including the switch transistor MN_S and bypassing the protection resistor Rp can be established in the switch protection resistor 120. In contrast, when an ESD event occurs, an electric potential of the first power line may be elevated by a large amount of electric charges provided to the pad Pad, and the ESD detector 130 may detect such potential elevation of the first power line. Further, the ESD detector 130 may be configured to turn off the switch transistor MN_S of the switch protection resistor 120 when the electric potential of the first power line is elevated beyond a reference voltage value. That is, if an ESD event occurs, the switch transistor MN_S is turned off in response to the switch control signal RSW received from the ESD detector 130, and thus, the pad Pad and the second driver 115 are connected to each other through the protection resistor Rp. For example, the ESD detector 130 may generate the switch control signal RSW such that it has a voltage level (e.g., a first voltage level) capable of turning off the switch transistor MN_S in response to the voltage of the first power line (or the second power line) being higher than a reference voltage value. Further, the ESD detector 130 may generate the switch control signal RSW such that it has a voltage level (e.g., a second voltage level) capable of turning on the switch transistor MN_S in response to the voltage of the first power line (or the second power line) being lower than the reference voltage value.

The clamp circuit 140 may be configured to detect an abnormal change of the power voltages VDD1 and VDD2 of the first and second power lines, which may be caused by an ESD event, and may produce or remove a discharging path. For example, in a case in which at least one of the power voltages VDD1 and VDD2 is abnormally increased or decreased, the clamp circuit 140 may turn on a switch provided between the first and second power lines. That is, the clamp circuit 140 may provide an electric path capable of bypassing an electric shock, which may be applied to the internal circuit 150, and thereby protect the internal circuit 150 from the ESD event or the electric shock.

The internal circuit 150 may be configured to perform an internal operation of the semiconductor device 100 and thereby produce internal data or process external data transmitted from a device external to the semiconductor device 100. For example, the internal circuit 150 may generate driving signals DRV for transmitting data to a device external to the semiconductor device 100. For convenience of explanation, a detailed description of the structure and function of the internal circuit 150 is omitted herein.

Utilization of the switch protection resistor 120 in the semiconductor device 100 allows for the second driver 115 connected to the pad Pad to be effectively protected. In normal operation, the switch transistor MN_S is used as a current path connecting the pad Pad to the second power line and bypassing the protection resistor Rp. In contrast, when an ESD event occurs, the switch transistor MN_S may be turned off and the pad Pad and the second driver 115 may be connected to each other through the protection resistor Rp. Accordingly, an amount of electric current flowing into the second driver 115 may be limited, and an improved protection function for the second driver 115 may be provided.

In addition, the normal operation may be performed through the current path bypassing the protection resistor Rp, and thus, an overall terminal resistance may be prevented from being affected by the resistance of the protection resistor Rp. As a result, the resistance of the protection resistor Rp may be increased up to a sufficiently high level in view of ESD protection efficiency.

Figure 2:
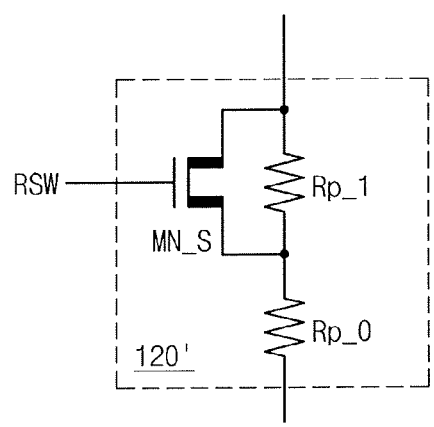
FIG. 2 is a circuit diagram illustrating an example of a switch protection resistor of FIG. 1 according to an exemplary embodiment of the inventive concept.

FIG. 2 is a circuit diagram illustrating an example of the switch protection resistor of FIG. 1 according to an exemplary embodiment of the inventive concept. Referring to FIG. 2, a switch protection resistor 120' may include a transistor MN_S, a first protection resistor Rp_0, and a second protection resistor Rp_1. The first protection resistor Rp_0 is connected to the pad Pad, and the second protection resistor Rp_1 is connected between the first protection resistor Rp_0 and the first driver 110.

The first protection resistor Rp_0 may be configured to have an electric resistance allowing for an improved normal operation. For example, when the semiconductor device 100 of FIG. 1 is normally operating, the switch control signal RSW may be activated, and thus, the switch transistor MN_S may be turned on. As a result, a current path between the pad Pad and the second driver 115 may have an electric resistance given by that of the first protection resistor Rp_0. In an exemplary embodiment, the first protection resistor Rp_0 may be configured to have an electric resistance allowing for an improved normal operation of the second driver 115. Alternatively, the first protection resistor Rp_0 may be provided to have an electric resistance allowing for an improved terminal resistance of the pad Pad. An additional circuit for adjusting a terminal resistance thereof may further be connected to the pad Pad. In this case, the first protection resistor Rp_0 and the additional circuit may be configured in a manner such that a resultant resistance thereof has a level for achieving an improved driving condition.

When an ESD event occurs, the switch transistor MN_S may be turned off by the switch control signal RSW. The first and second protection resistors Rp_0 and Rp_1 may form a current path connecting the pad Pad to the second driver 115 in series. As a result, an amount of electric current flowing from the pad Pad to the second driver 115 caused by the ESD event may be substantially reduced. In an exemplary embodiment, in a case in which the semiconductor device 100 is normally operated, the resistance of the second protection resistor Rp_1 may not be considered. Accordingly, the resistance of the second protection resistor Rp_1 can be set in consideration of efficiency in ESD protection for the second driver 115.

The switch transistor MN_S may select or bypass the second protection resistor Rp_1 in response to the switch control signal RSW. For example, in normal operation, the switch control signal RSW may be used to turn on the switch transistor MN_S and thereby connect the pad Pad to the second driver 115 with an improved resistance (e.g., via the first protection resistor Rp_0). In contrast, when there is an ESD event, the switch control signal RSW may be used to turn off the switch transistor MN_S and thereby connect the pad Pad to the second driver 115 with a resultant resistance of Rp_0+Rp_1.

It is to be understood that the structure of the switch protection resistor 120 is not limited to that of the illustrated circuit diagram shown in FIG. 2. For example, the switch protection resistor 120 may be configured to include a variable resistance device having a resistance that can be changed by the switch control signal RSW. That is, the switch protection resistor 120 may be configured in such a way that the resistance thereof is selectively changed within a range from about 0Ω to a level that is high enough to protect the second driver 115 in response to the switch control signal RSW.

Figure 3:
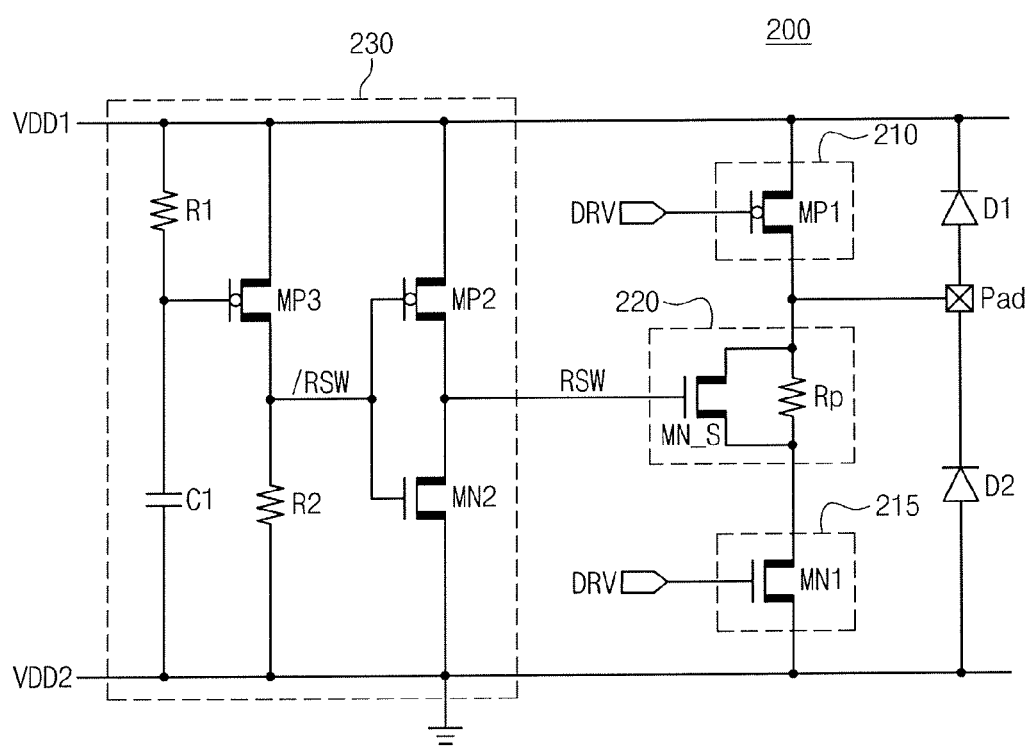
FIG. 3 is a circuit diagram illustrating an electrostatic discharge circuit of the semiconductor device of FIG. 1 according to an exemplary embodiment of the inventive concept.

FIG. 3 is a circuit diagram illustrating an electrostatic discharge circuit of the semiconductor device of FIG. 1 according to an exemplary embodiment of the inventive concept. Referring to FIG. 3, a semiconductor device 200 may include drivers 210 and 215, a switch protection resistor 220, and an ESD detector 230. The drivers 210 and 215 may be configured to transfer driving signals to the pad Pad. The pad Pad and the diodes D1 and D2 may be configured to have the same features as those described above with reference to FIG. 1, and thus, a detailed description thereof may be omitted.

Each of the drivers 210 and 215 may be provided in the form of a high voltage transistor and may be used to pull up or pull down a voltage level of the pad Pad in response to the driving signal DRV. The first driver 210 may pull up the voltage level of the pad Pad to the first power voltage VDD1 in response to the driving signal DRV. The first driver 210 may be, for example, a PMOS transistor MP1. The second driver 215 may pull down the voltage level of the pad Pad to the second power voltage VDD2 in response to the driving signal DRV. The second driver 215 may be, for example, an NMOS transistor MN1. However, the type of the first and second driver 210 and 215 is not limited thereto.

The switch protection resistor 220 may be disposed between the pad Pad and the second driver 215. The switch protection resistor 220 may include the protection resistor Rp and a high voltage transistor (e.g., an NMOS transistor) connected in parallel to the protection resistor Rp. The description that follows will refer to an example in which the switch transistor MN_S is an NMOS transistor. However, the switch transistor is not limited thereto. For example, in an exemplary embodiment, the switch transistor MN_S may be a PMOS transistor or may include at least one device capable of serving as a switching element.

The protection resistor Rp may be configured to control an amount of electric current flowing into the second driver 215 when an ESD event occurs. For example, the protection resistor Rp may restrict an amount of electric current flowing into the NMOS transistor MN1 of the second driver 215. A resistance level of the protection resistor Rp may be determined in consideration of a limit or endurable level in current or voltage of the second driver 215. The protection resistor Rp may be connected between the pad Pad and a common drain shared by the PMOS transistor MP1 of the first driver 210 and the NMOS transistor MN1 of the second driver 215.

The ESD detector 230 may be configured to detect an ESD event to be transmitted through the pad Pad and produce a switch control signal RSW for controlling the switch protection resistor 220. The ESD detector 230 may include an RC circuit (resistor-capacitor circuit) including a first resistor R1 and a first capacitor C1, a PMOS transistor MP3, and a second resistor R2, and may be configured to generate a detection signal /RSW at an instant delayed from a rising instant of the first power voltage VDD1. In addition, the ESD detector 230 may further include transistors MP2 and MN2, which serve as an inverter or are configured to invert the detection signal /RSW and thereby generate the switch control signal RSW.

The ESD detector 230 may be configured to detect an abnormal rising of the first power voltage VDD1 and turn off the switch transistor MN_S based on such detection. The RC circuit of the ESD detector 230 may include the first resistor R1 and the first capacitor C1 connected in series to each other. In a case in which there is an abrupt elevation in electric potential of the first power voltage VDD1, the RC circuit may be configured to provide an electric potential to a gate electrode of PMOS transistor MP3 after a time given by a time constant $\tau$ (e.g., $\tau=R1 \times C1$) elapses. That is, the RC circuit may serve as a low pass filter slowing the abrupt elevation of the electric potential.

In normal operation, the ESD detector 230 may produce the switch control signal RSW, which may be used to turn on the switch transistor MN_S. In a case in which the first power voltage VDD1 is provided in the form of direct current (DC), the first capacitor C1 may substantially be in a cut-off mode. Accordingly, the PMOS transistor MP3 may remain in a turn-off state. As a result, a source node of the PMOS transistor MP3 may have a low voltage level which is used as the detection signal /RSW. The switch control signal RSW, which is of a relatively high level, may be an inverted signal of the detection signal /RSW and may be applied to the switch transistor MN_S. Accordingly, the switch transistor MN_S may remain in a turn-on state.

Even if an electric potential of the first power voltage VDD1 is abruptly elevated by an ESD event, the PMOS transistor MP3 may remain in a turn-on state during an initial duration. If a gate thereof has an electric potential higher than a specific level, the PMOS transistor MP3 may be turned-off, and thus, the detection signal /RSW may be decreased to about 0 V or ground.

As described above, the switch control signal RSW, which was inverted during the elevation of the detection signal /RSW, may remain at ground for a period of time. At this time, the switch transistor MN_S may be turned off, and the pad Pad and the second driver 215 may be connected to each other through the protection resistor Rp. That is, when the ESD event occurs and the first power voltage VDD1 is abruptly elevated, the switch transistor MN_S may be turned off, thereby restricting an amount of electric current abruptly flowing into the second driver 215. A detailed operation of the ESD detector 230 and the switch transistor MN_S will be described with reference to FIGS. 5, 6A, and 6B.

According to exemplary embodiments of the inventive concept, utilization of the ESD detector 230 allows for the switch control signal RSW to be generated, which can turn off the switch transistor MN_S for a delay time caused by the RC circuit. Thus, even in an initial stage of the ESD event accompanied with an abrupt elevation of the first power voltage VDD1, the second driver 215 may be effectively protected by the protection resistor Rp. The RC circuit may delay an AC component of the first power voltage VDD1 for a specific duration, and a PMOS transistor and inverter of the ESD detector 230 may be configured to allow the switch control signal RSW to have a voltage level capable of turning off the switch transistor MN_S for the specific duration.

Figure 4A:
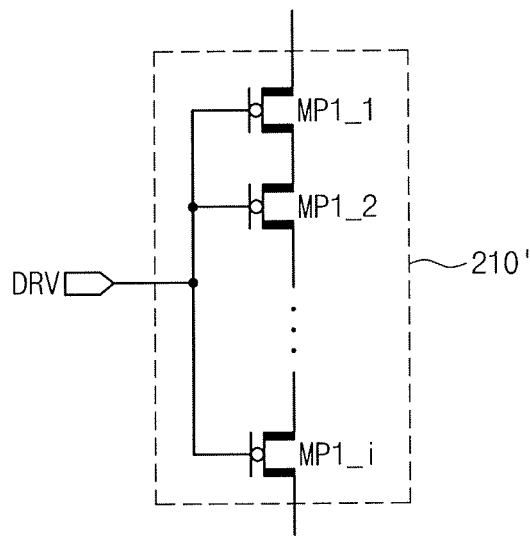
FIGS. 4A and 4B are circuit diagrams illustrating examples of the first and second drivers, respectively, of FIG. 3, according to exemplary embodiments of the inventive concept.
Figure 4B:
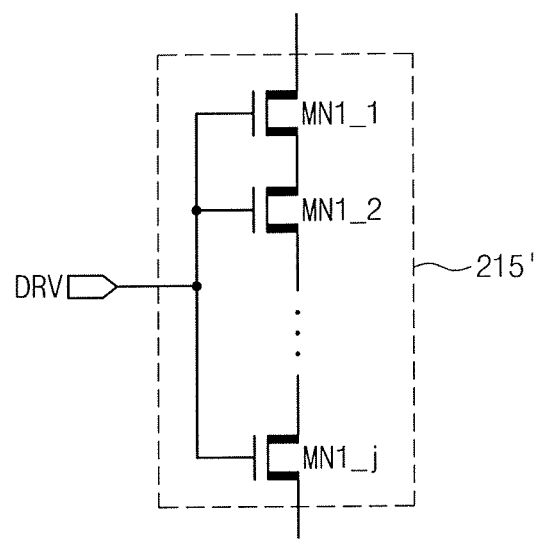

FIGS. 4A and 4B are circuit diagrams illustrating examples of the first and second drivers 210 and 215, respectively, of FIG. 3, according to exemplary embodiments of the inventive concept.

Referring to FIG. 4A, a first driver 210' may include a plurality of PMOS transistors MP1_1 to MP1_i that are connected in series between drain and source nodes. A gate of each of the plurality of PMOS transistors MP1_1 to MP1_i may be connected to the driving signal DRV. The use of the first driver 210' may allow for controlling a level of the pull-up voltage to be output to the pad Pad. As shown, the first driver 210' may include at least two PMOS transistors.

Referring to FIG. 4B, a second driver 215' may include a plurality of NMOS transistors MN1_1 to MN1_j that are connected in series between drain and source nodes. A gate of each of the plurality of NMOS transistors MN1_1 to MN1_j may be controlled by the driving signal DRV. As shown, the second driver 215' may include at least two NMOS transistors.

In exemplary embodiments, transistors (e.g., the PMOS and NMOS transistors MP1_1 to MP1_i and MN1_1 to MN1_j) of the first and second drivers 210' and 215' may be provided in the form of a high voltage transistor.

Figure 5:
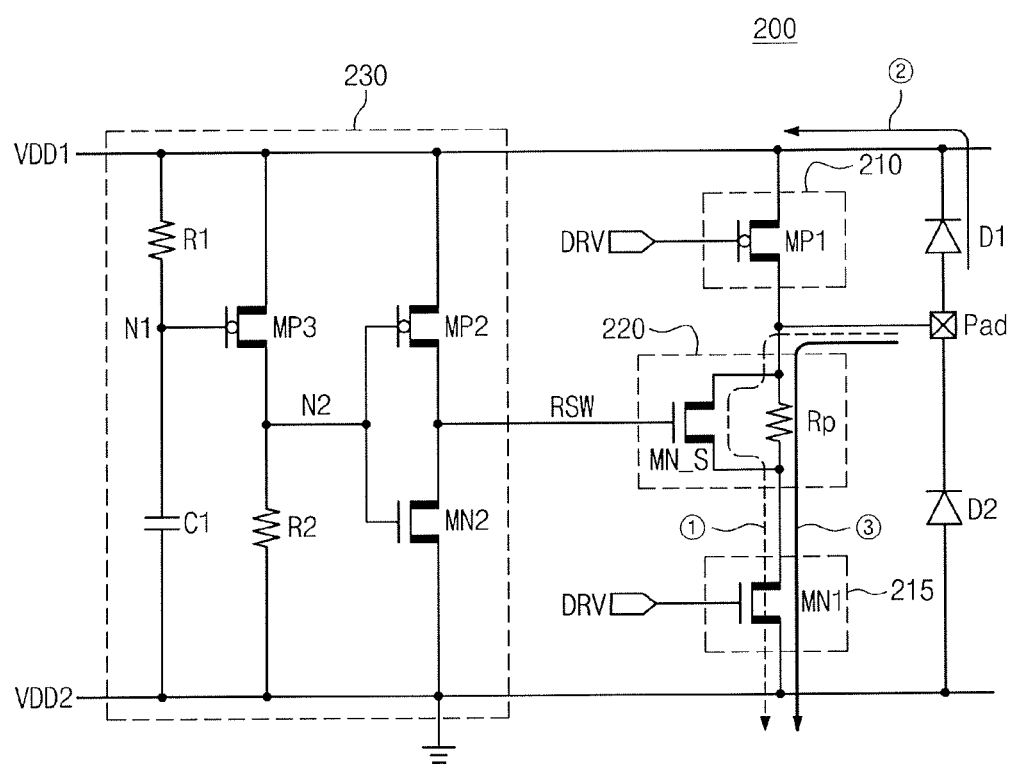
FIG. 5 is a circuit diagram illustrating an example of current paths in normal and ESD-induced abnormal operations of the semiconductor device of FIG. 3 according to an exemplary embodiment of the inventive concept.

FIG. 5 is a circuit diagram illustrating an example of current paths in normal and ESD-induced abnormal operations of the semiconductor device of FIG. 3 according to an exemplary embodiment of the inventive concept. Referring to FIG. 5, in normal operation, the pad Pad may be connected to the NMOS transistor MN1 of the second driver 215 via the switch transistor MN_S. When an ESD event occurs, the pad Pad may be connected to the NMOS transistor MN1 of the second driver 215 via the protection resistor Rp.

For example, the power voltages VDD1 and VDD2 may have constant levels in normal operation. Accordingly, since an electric potential of the pad Pad is determined by the drivers 210 and 215, the pad Pad may have a voltage level that is lower than the first power voltage VDD1 and higher than the second power voltage VDD2. Under this condition, the diodes D1 and D2, which are provided between the first and second power lines via the pad Pad, may be in a reverse bias condition.

Under the above-described condition for the normal operation, the ESD detector 230 may output a switch control signal RSW of a high level. For example, the RC circuit including the first resistor R1 and the first capacitor C1 may be connected to the first power voltage VDD1, and thus, the first node N1 may be at the same level as the first power voltage VDD1. This is because in a DC bias state, the first capacitor C1 may be substantially in the cut-off mode. Thus, the PMOS transistor MP3 may remain in the turn-off state. As a result, the second node N2 serving as a drain region of the PMOS transistor MP3 may have substantially the same level as the second power voltage VDD2.

The PMOS transistor MP2 and the NMOS transistor MN2 may constitute an inverter circuit inverting a logic level of the second node N2. The inverted logic level may be output as the switch control signal RSW. Accordingly, during the normal operation, the switch control signal RSW may remain at a high level.

Since the switch control signal RSW is at the high level, the switch transistor MN_S may be in the turn-on state. Accordingly, a current path activated during the normal operation is formed to pass through the switch transistor MN_S but not through the protection resistor Rp. That is, during the normal operation, there may be substantially no resistance between the pad Pad and the second driver 215. The reference numeral (1) in FIG. 5 shows the current path that is activated during the normal operation.

In contrast, if an ESD event occurs (e.g., as a result of electric charges supplied through the pad Pad), the pad Pad may have an electric potential higher than the first power voltage VDD1. Accordingly, the first diode D1 may be turned on and the electric charges may flow from the pad Pad into the first power line. The reference numeral (2) in FIG. 5 shows such a current flow caused by the ESD event. As a result, the first power voltage VDD1 may have an abruptly elevated level.

When the electric potential of the first power voltage VDD1 is abruptly elevated by the ESD event, the switch control signal RSW of a low level may be output from the ESD detector 230. For example, the ESD detector 230 may be configured to detect the abrupt elevation of the first power voltage VDD1 and turn off the switch transistor MN_S for a period of time, as described in further detail below.

When an ESD event occurs, the first power voltage VDD1 may be elevated in a surge manner. Due to the presence of the RC circuit including the first resistor R1 and the first capacitor C1, a voltage of the first node N1 may be set with the first power voltage VDD1 after a specific time (e.g., given by the time constant τ) elapses. That is, the voltage of the first node N1 may remain at a low level during the specific time, and then, may be elevated. When the voltage of the first node N1 is at the low level, the PMOS transistor MP3 may remain in a turn-on state.

When the PMOS transistor MP3 is turned on, a voltage of the second node N2 may be elevated to a high level. During the high voltage level of the second node N2, the switch control signal RSW may remain at a low level. That is, during the specific time after the ESD event occurs, the switch control signal RSW may remain at the low level, which may result in turning off the switch transistor MN_S and forming a current path passing through the protection resistor Rp between the pad Pad and the second driver 215. Accordingly, the ESD-induced current may be prevented from flowing into the second driver 215 or the NMOS transistor MN1. The reference numeral (3) in FIG. 5 shows the ESD-induced current flow passing through the protection resistor Rp.

Figure 6A:
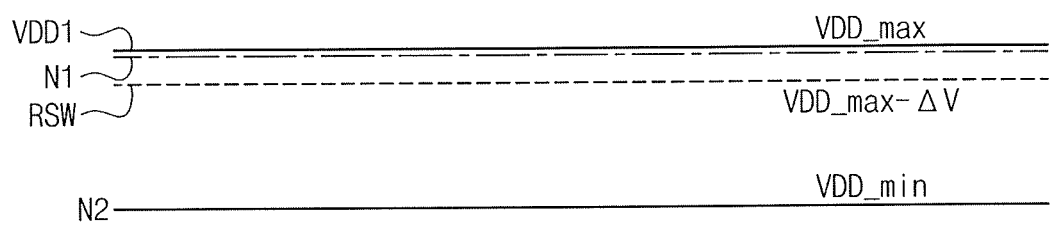
FIGS. 6A and 6B are timing diagrams illustrating temporal variations in voltage levels of power and node voltages of the circuit of FIG. 5, which is operated in normal and ESD-induced abnormal modes, respectively, according to an exemplary embodiment of the inventive concept.
Figure 6B:
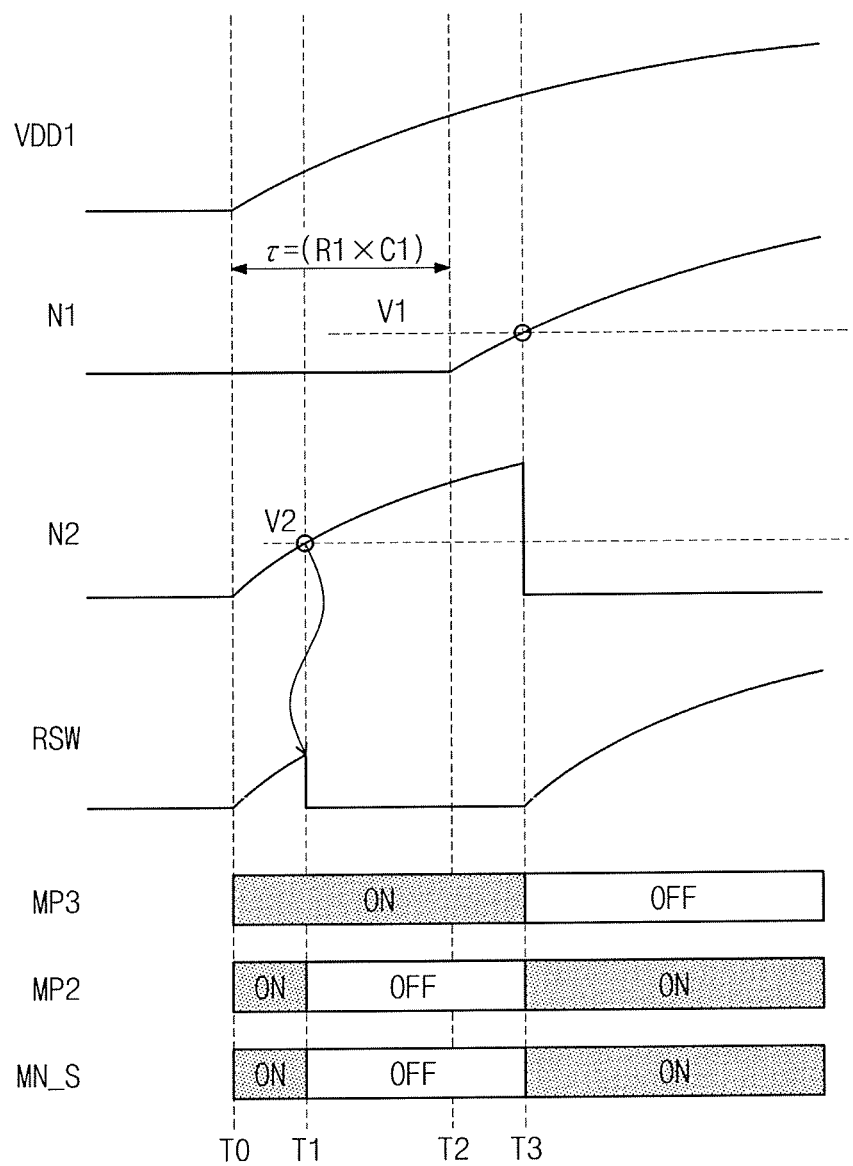

FIGS. 6A and 6B are timing diagrams illustrating temporal variations in voltage levels of power and node voltages of the circuit of FIG. 5, which is operated in normal and ESD-induced abnormal modes, respectively, according to an exemplary embodiment of the inventive concept.

Referring to FIG. 6A, in normal operation, the first power voltage VDD1 may be at the constant level VDD_max. Accordingly, due to the presence of the RC circuit including the first resistor R1 and the first capacitor C1, a voltage of the first node N1 may be at substantially the same level (e.g., VDD_max) as that of the first power voltage VDD1. This is because in a DC bias state, the first capacitor C1 may be substantially in the cut-off mode. Thus, the PMOS transistor MP3 may remain in the turn-off state. As a result, the second node N2 serving as a drain region of the PMOS transistor MP3 may have substantially the same voltage level as the second power voltage VDD2 (e.g., VDD_min).

Due to the presence of the inverter circuit including the PMOS and NMOS transistors MP2 and MN2, a logic level of the second node N2 may be inverted and output as the switch control signal RSW. Accordingly, in normal operation, the switch control signal RSW may have a voltage that is given by subtracting a voltage drop ($\Delta V$) between drain source regions of PMOS transistor MP2 from the voltage of the first power line (e.g., VDD_max−$\Delta V$). Since the voltage drop is negligibly small, the switch transistor MN_S may remain in the turn-on state.

Hereinafter, an operation of the electrostatic discharge circuit of FIG. 5, which is performed when an ESD event occurs, will be described with reference to FIG. 6B.

In the current example, assume that at time T0, a large amount of electric charges are supplied into the semiconductor device through the pad Pad. Then, the first diode D1 provided between the pad Pad and the first power line may be turned on to abruptly elevate an electric potential of the first power line. For example, as illustrated in the timing diagram of FIG. 6B, the first power line may have an electric potential increasing from the first power voltage VDD1. Despite the elevation of the first power voltage VDD1, the electric potential of the first node N1 may start to be elevated at time T2 when a specific time elapses from T0. This is because, due to the presence of the RC circuit including the first resistor R1 and the first capacitor C1, the voltage of the first node N1 may be set with the first power voltage VDD1 after the specific time (e.g., given by the time constant $\tau$) elapses. That is, the voltage of the first node N1 may remain at a low level during the specific time or the time constant $\tau$, and then, may be elevated. Accordingly, during the time period from time T0 to time T2, the PMOS transistor MP3 may remain in the turn-on state. Thus, the elevation of the electric potential of the second node N2 may be started at the time T0. However, after a time T1 elapses from T0, the electric potential of the second node N2 may be elevated to a high level (e.g., higher than V2) capable of turning off the PMOS transistor MP2 of the inverter circuit. Then, during the time period from T0 to T1, the PMOS transistors MP3 and MP2 may be in the turned-on state, and as a result, the switch transistor MN_S may be in the turned-on state. However, the switch control signal RSW may not be sufficiently set during such a transition period from T0 to T1, and in this case, the switch transistor MN_S may remain in the turned-off state. Such an operation condition may be adjusted depending on the time constant of the RC circuit.

At time T1, the voltage of the second node N2 may be elevated to a level capable of turning off the PMOS transistor MP2. That is, the PMOS transistor MP2 may be turned off, and thus, the switch control signal RSW may remain at a low level. The switch control signal RSW may be at the low level until time T3 elapses from time T0. During the period from T1 to T3, the switch transistor MN_S may also remain in the turned off state. During the time period from T1 to T3, the protection resistor Rp may be connected between the pad Pad and the second driver 215. As a result, an amount of electric current abruptly flowing into the second driver 215 through the pad Pad may be restricted. That is, the protection for the second driver 215 or the NMOS transistor MN1 may be activated.

After time T2, the electric potential of the first node N1 may be elevated. For example, at time T3, the electric potential of the first node N1 may reach a level V1 capable of turning off the PMOS transistor MP3. In exemplary embodiments, the voltage levels V1 and V2 may be substantially the same as or different from each other. If the PMOS transistor MP3 is turned off, the electric potential of the second node N2 may be lowered to ground. Accordingly, the voltage level of the switch control signal RSW may be elevated, and the switch transistor MN_S may be turned on. From this time, protection devices such as the clamp circuit 140 of FIG. 1 may be activated, and electric charges supplied from the pad Pad may start to be discharged.

Figure 7:
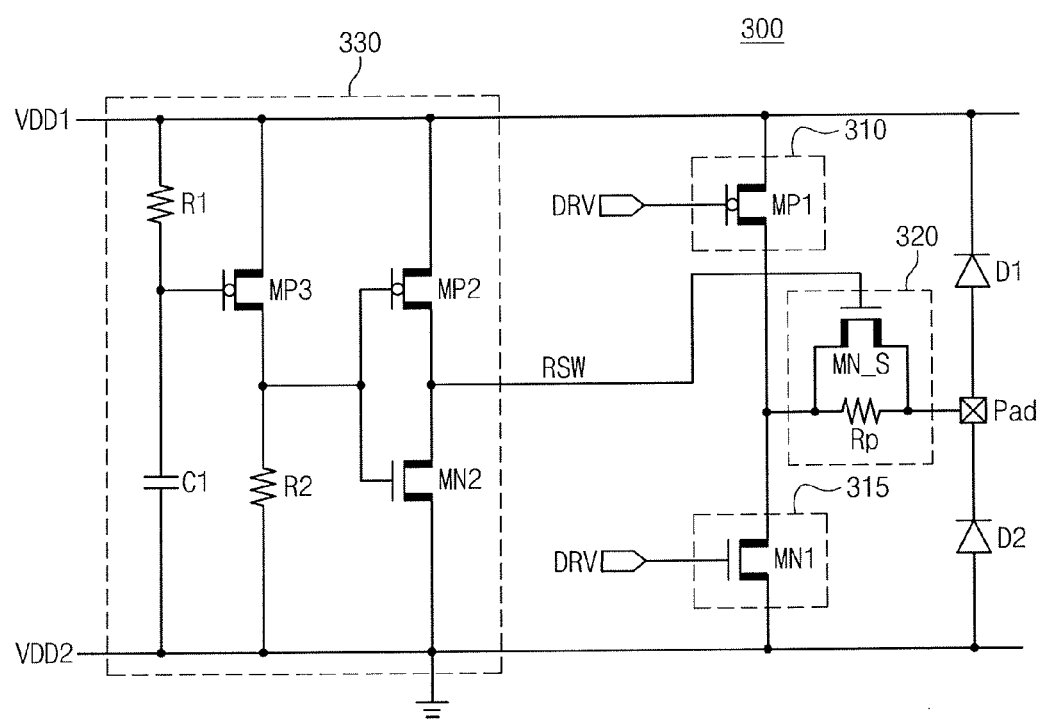
FIG. 7 is a circuit diagram illustrating an electrostatic discharge circuit according to an exemplary embodiment of the inventive concept.

FIG. 7 is a circuit diagram illustrating an electrostatic discharge circuit according to an exemplary embodiment of the inventive concept. Referring to FIG. 7, an electrostatic discharge circuit included in a semiconductor device 300 may include substantially the same components and configuration as that of FIG. 3, except for a difference in position of the electrostatic discharge circuit and the switch protection resistor. For example, as shown in FIG. 7, the electrostatic discharge circuit may include a switch protection resistor 320 provided between the pad Pad and the drivers 310 and 315.

In normal operation, an ESD detector 330 may be configured in such a way that a switch control signal RSW is at a high level. The ESD detector 330 may be operated in the same manner as the ESD detector 230 of FIG. 3. For example, in normal operation, the switch transistor MN_S may be turned on. In contrast, if an ESD event occurs, the switch transistor MN_S may be turned off. In this case, a protection resistor Rp may be used as a current path between the pad Pad and a second driver 315, thereby restricting an amount of electric current flowing into the second driver 315 when the pad Pad has an abruptly elevating electric potential.

Figure 8:
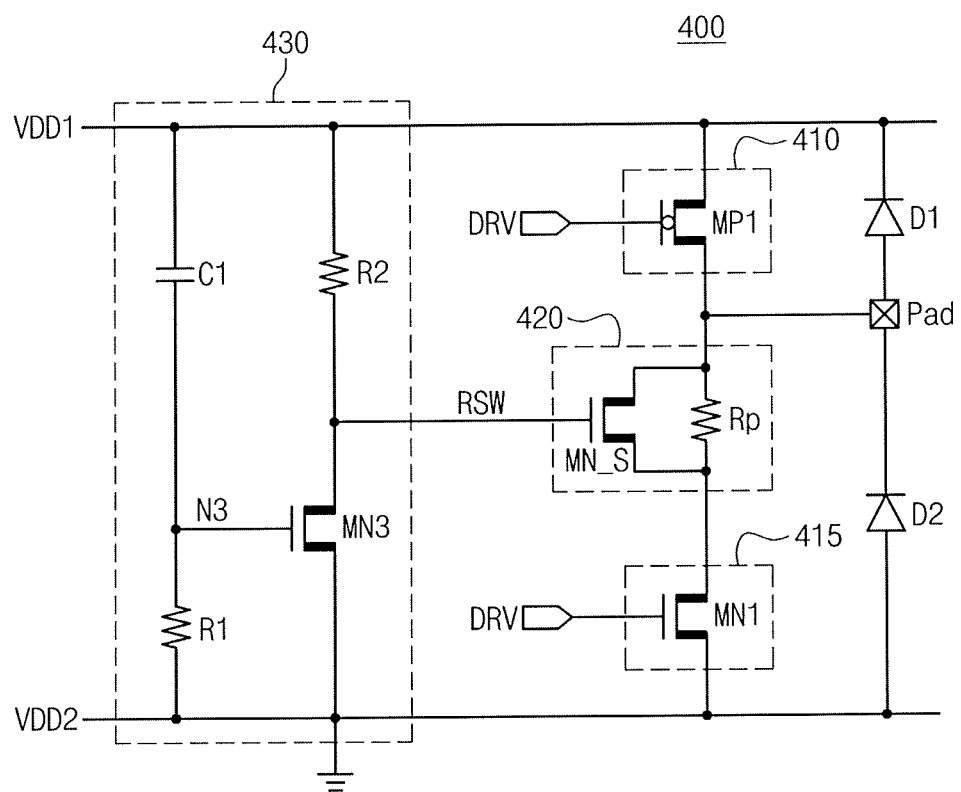
FIG. 8 is a circuit diagram illustrating an electrostatic discharge circuit according to an exemplary embodiment of the inventive concept.

FIG. 8 is a circuit diagram illustrating an electrostatic discharge circuit according to an exemplary embodiment of the inventive concept. Referring to FIG. 8, an electrostatic discharge circuit included in a semiconductor device 400 may include an ESD detector 430 including an RC circuit. The electrostatic discharge circuit 400 may further include drivers 410 and 415, a switch protection resistor 420, a pad Pad, and diodes D1 and D2, which may be configured in substantially the same manner as those of FIG. 3. For convenience of description, a detailed description thereof is omitted herein.

In the ESD detector 430, the RC circuit may serve as a high pass filter. For example, the RC circuit may include a first resistor R1, which is connected to a second power line applied with a second power voltage VDD2, and a first capacitor C1, which is connected to a first power line applied with a first power voltage VDD1. In this case, if the first power voltage VDD1 has an AC (alternating current) component, such an AC component may be provided to a third node N3 via the first capacitor C1. That is, in the ESD detector 430, the AC component of the first power voltage VDD1 may be transmitted to the third node N3 and may be used to control an NMOS transistor MN3. The high pass filter may generate the switch control signal RSW in response to the AC component of the first power voltage VDD1. In addition, the high pass filter may generate the switch control signal RSW in response to a direct current (DC) component of the first power voltage VDD1.

In normal operation, a voltage of the third node N3 may remain at a high level, which is given by the first power voltage VDD2. This is because, during the normal operation, the first power voltage VDD1 with a constant level may not be applied to the third node N3 as a result of the presence of the first capacitor C1. Accordingly, during the normal operation, the NMOS transistor MN3 may remain in the turned-off state. As a result, the switch control signal RSW may have a high level, and may be transmitted from the first power voltage VDD1 and dropped by the second resistor R2. During the normal operation, the switch transistor MN_S may remain in the turned-on state. Thus, during the normal operation, the protection resistor Rp is not used as a current path. That is, during the normal operation, the pad Pad and the second driver 415 may be connected to each other without going through a resistor.

In contrast, when an ESD event occurs, the ESD detector 430 may detect an abrupt elevation of the first power voltage VDD1 and filter an AC component from the first power voltage VDD1, and the NMOS transistor MN3 may be turned on by the filtered first power voltage VDD1. If the NMOS transistor MN3 is turned on, the switch control signal RSW may have a low voltage level, which is given by the second power voltage VDD2, and thus, the switch transistor MN_S may be turned off. That is, when the ESD event occurs, the pad Pad and the second driver 415 may be connected to each other via a current path passing through the protection resistor Rp.

According to an exemplary embodiment of the inventive concept, the ESD detector 430 may be configured to include or serve as a high pass filter. For example, as a result of an abruptly increasing level of the first power voltage VDD1, the switch control signal RSW may have a low voltage level, and thus, the switch transistor MN_S may be turned off. Accordingly, the second driver 415 may be prevented from being damaged by a large amount of electric charges flowing through the pad Pad when an ESD event occurs.

Figure 9A:
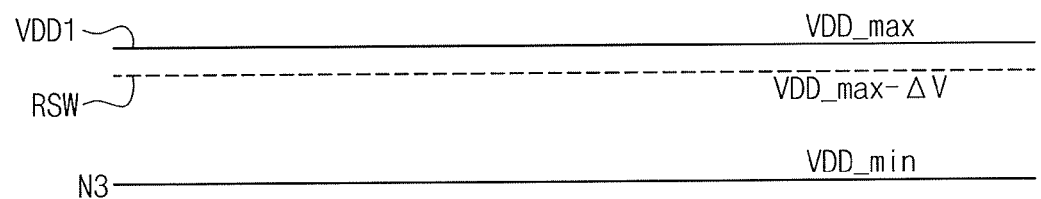
FIGS. 9A and 9B are timing diagrams illustrating an operation of the electrostatic discharge circuit of FIG. 8 according to an exemplary embodiment of the inventive concept.
Figure 9B:
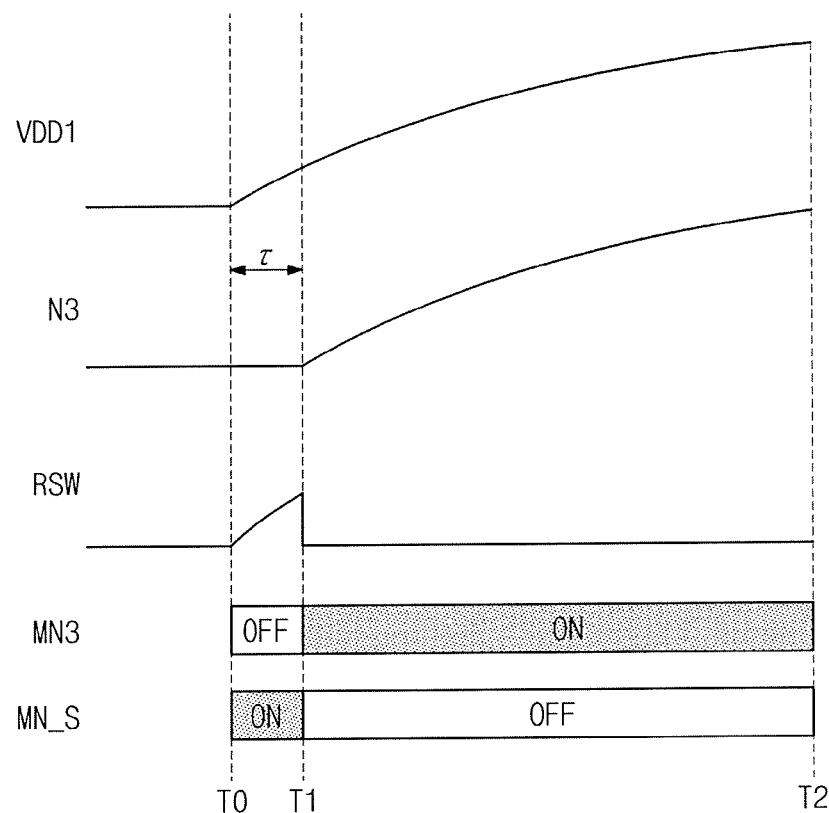

FIGS. 9A and 9B are timing diagrams illustrating an operation of the electrostatic discharge circuit of FIG. 8 according to an exemplary embodiment of the inventive concept. FIG. 9A is a timing diagram illustrating a voltage of each node of the electrostatic discharge circuit in normal operation, and FIG. 9B is a timing diagram illustrating a power voltage and node voltages when an ESD event occurs.

Referring to FIG. 9A, in normal operation, the first power voltage VDD1 may be at the constant level VDD_max. The third node N3 may remain at a level (e.g., VDD_min) which is given by the second power voltage VDD2. Accordingly, due to the relatively low voltage level of the third node N3, the NMOS transistor MN3 may be turned off, and thus, an electric potential of the switch control signal RSW may be determined by the voltage of the first power line. In a case in which the semiconductor device is normally operated under such a condition, the switch transistor MN_S may remain in the turned-on state.

Hereinafter, an operation of the electrostatic discharge circuit of FIG. 8, which is performed when an ESD event occurs, will be described with reference to FIG. 9B.

In a case in which at time T0, a large amount of electric charges are supplied into the semiconductor device through the pad Pad, the first diode D1 disposed between the pad Pad and the first power line may be turned on, and an electric potential of the first power line may be abruptly elevated. For example, as illustrated in the timing diagram of FIG. 9B, the first power line may have an electric potential increasing from the first power voltage VDD1. Despite the elevation of the first power voltage VDD1, the electric potential of the third node N3 may start to be elevated at time T1 when a specific time elapses from T0. This is because, due to the presence of the RC circuit including the first resistor R1 and the first capacitor C1, the voltage of the third node N3 may be set with the first power voltage VDD1 after the specific time (e.g., given by the time constant τ) elapses. That is, the voltage of the third node N3 may remain at a low level during the specific time or the time constant τ, and then may be elevated.

Accordingly, during the time period from T0 to T1, the NMOS transistor MN3 may remain in the turn-off state, and the switch control signal RSW may be elevated to a high level, which is given by the elevated level of the first power voltage VDD1. That is, during the time period from T0 to T1, the switch transistor MN_S may be in the turned-on state.

At time T1, a voltage level of the third node N3 may start to be elevated to turn on the NMOS transistor MN3. If the NMOS transistor MN3 is turned on (e.g., from T1 to T2), the switch transistor MN_S may be turned off (e.g., from T1 to T2), and thus, the pad Pad may be connected to the second driver 415 via a current path passing through the protection resistor Rp. As a result, an amount of electric current abruptly flowing into the second driver 415 through the pad Pad may be restricted. That is, the protection for the second driver 415 or the NMOS transistor MN1 may be activated.

Figure 10:
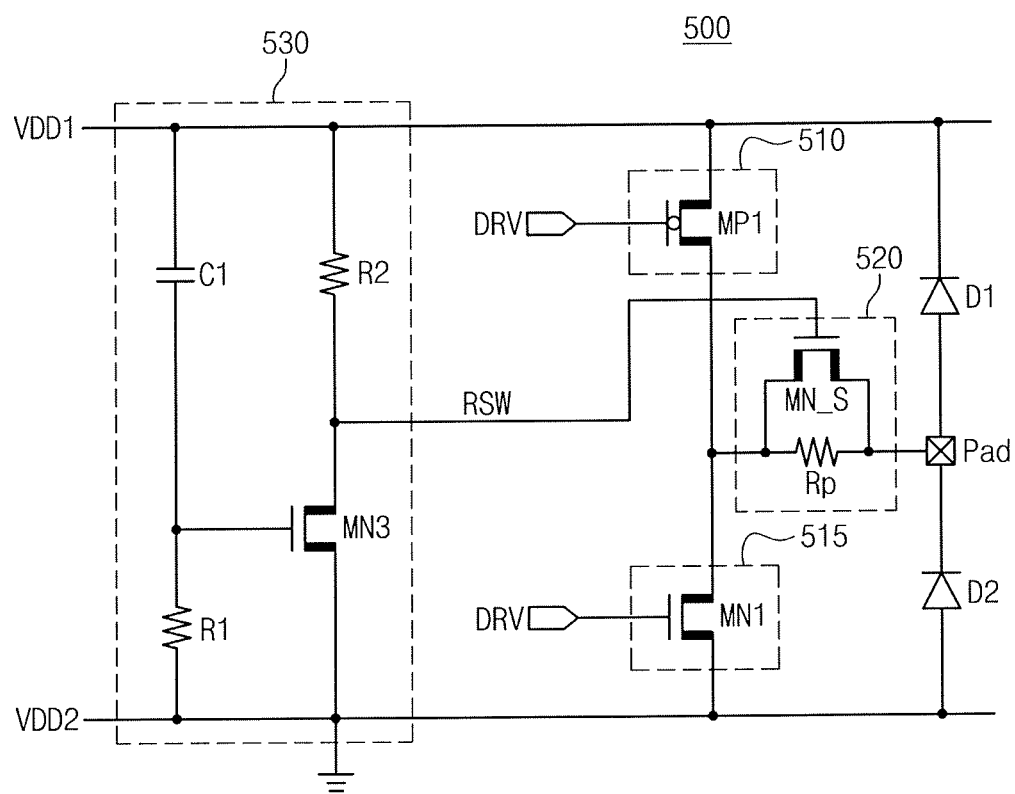
FIG. 10 is a circuit diagram illustrating an electrostatic discharge circuit according to an exemplary embodiment of the inventive concept.

FIG. 10 is a circuit diagram illustrating an electrostatic discharge circuit according to an exemplary embodiment of the inventive concept. Referring to FIG. 10, an electrostatic discharge circuit included in a semiconductor device 500 may be configured to have substantially the same components and configuration as that of FIG. 8, except for a difference in position of the electrostatic discharge circuit and the switch protection resistor. For example, as shown in FIG. 10, the electrostatic discharge circuit included in the semiconductor device 500 may include a switch protection resistor 520 disposed between the pad Pad and the drivers 510 and 515.

In normal operation, an ESD detector 530 may be configured such that a switch control signal RSW has a high level. The ESD detector 530 may be operated in substantially the same manner as the ESD detector 430 of FIG. 8. For example, in the normal operation, the switch transistor MN_S may be turned on. In contrast, if an ESD event occurs, the switch transistor MN_S may be turned off. In this case, a protection resistor Rp may be used as a current path between the pad Pad and a second driver 515, thereby restricting an amount of electric current flowing into the second driver 515 when the pad Pad has an abruptly elevating electric potential.

Figure 11:
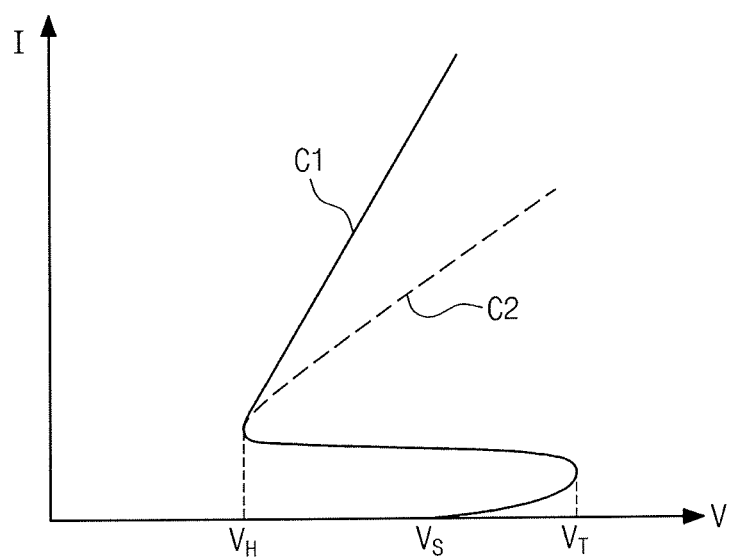
FIG. 11 is a graph showing an I-V characteristic of the second driver of FIG. 10 according to an exemplary embodiment of the inventive concept.

FIG. 11 is a graph showing an I-V characteristic of the second driver of FIG. 10 according to an exemplary embodiment of the inventive concept. Referring to FIG. 11, if an ESD voltage is applied to the pad Pad, the NMOS transistor MN1 of the second driver 515 1 may exhibit a manifest snapback property. Accordingly, in a case in which the protection resistor is not provided, such an ESD event may lead to deterioration or breakage of the NMOS transistor MN1.

For example, if there is no protection resistor, the ESD voltage applied to the NMOS transistor MN1 through the pad Pad may lead to an increase in both voltage V and current I between the drain and source nodes of the NMOS transistor MN1. However, if the drain-source voltage V of the NMOS transistor MN1 reaches a trigger voltage $V_T$, the current I may increase slightly and the voltage V may decrease. This phenomenon is referred to as a "snapback". Thereafter, as shown in the curve C1 of FIG. 11, the drain-source voltage V may decrease to a hold voltage $V_H$, at which the current I is abruptly increased by a latch-up phenomenon. Here, if the ESD voltage applied to the pad Pad is higher than the hold voltage $V_H$, the NMOS transistor MN1 may be damaged by an abruptly increasing current.

However, according to exemplary embodiments of the inventive concept, the protection resistor Rp with a relatively high resistance may be disposed between the pad Pad and the drain node of the NMOS transistor MN1. Due to the presence of the protection resistor Rp, a voltage level of a voltage applied to the NMOS transistor MN1 may be reduced when an ESD event occurs. Further, an amount of a current passing through a channel region of the NMOS transistor MN1 may be reduced. The curve C2 shows an electric current reduced by using the protection resistor Rp according to exemplary embodiments of the inventive concept.

Figure 12:
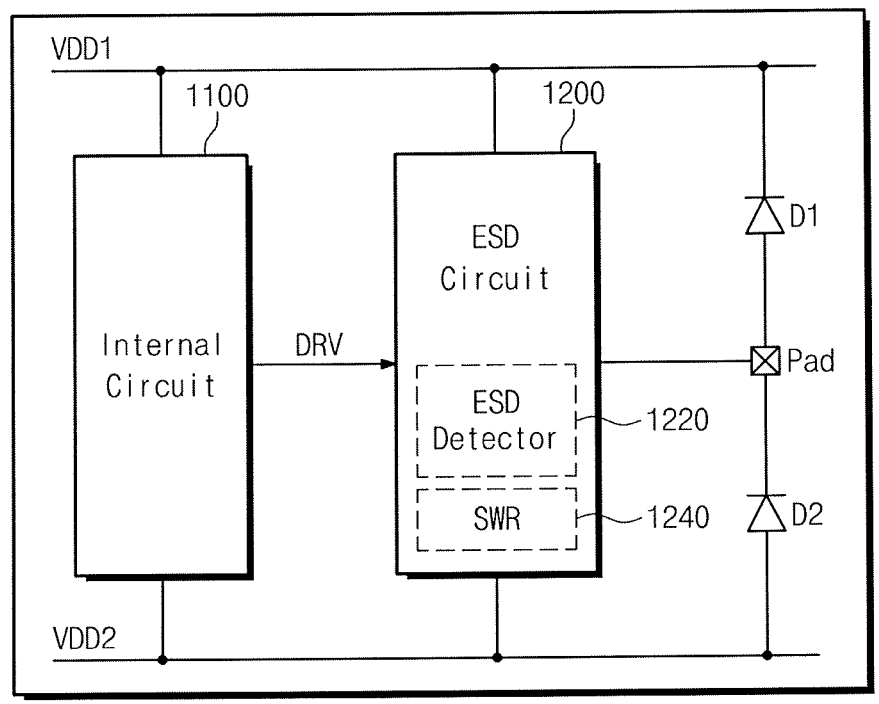
FIG. 12 is a block diagram illustrating a schematic configuration of a semiconductor device according to an exemplary embodiments of the inventive concept.

FIG. 12 is a block diagram illustrating a schematic configuration of a semiconductor device according to an exemplary embodiment of the inventive concept. Referring to FIG. 12, a semiconductor device 1000 may include an output pad Pad, diodes D1 and D2, an electrostatic discharge circuit 1200, and an internal circuit 1100. The diodes D1 and D2 and the electrostatic discharge circuit 1200 may be configured to discharge an ESD current. The components included in the semiconductor device 1000 may be the components described above according to exemplary embodiments of the inventive concept.

In normal operation, the internal circuit 1100 may output a driving signal DRV for pulling up or pulling down the output pad Pad. Here, the electrostatic discharge circuit 1200 may include a driver that is configured to pull up or pull down the pad Pad in response to the driving signal DRV.

The electrostatic discharge circuit 1200 may include an ESD detector 1220 that detects an ESD event and a switch protection resistor 1240. The switch protection resistor 1240 may include a switch element and a protection resistor Rp. The switch protection resistor 1240 may be controlled by the ESD detector 1220 such that the pad Pad is connected to the driver through the protection resistor Rp or without going through the protection resistor Rp. The ESD detector 1220 may detect a voltage level of the first or second power voltage VDD1 or VDD2 and control the switch protection resistor 1240 based on the detection result. For example, in normal operation, the switch protection resistor 1240 may be controlled in such a way that a current path bypassing the protection resistor Rp is formed between the pad Pad and the driver. In contrast, when an ESD event occurs, the switch protection resistor 1240 may be controlled such that a current path passing through the protection resistor Rp is formed between the pad Pad and the driver.

Figure 13:
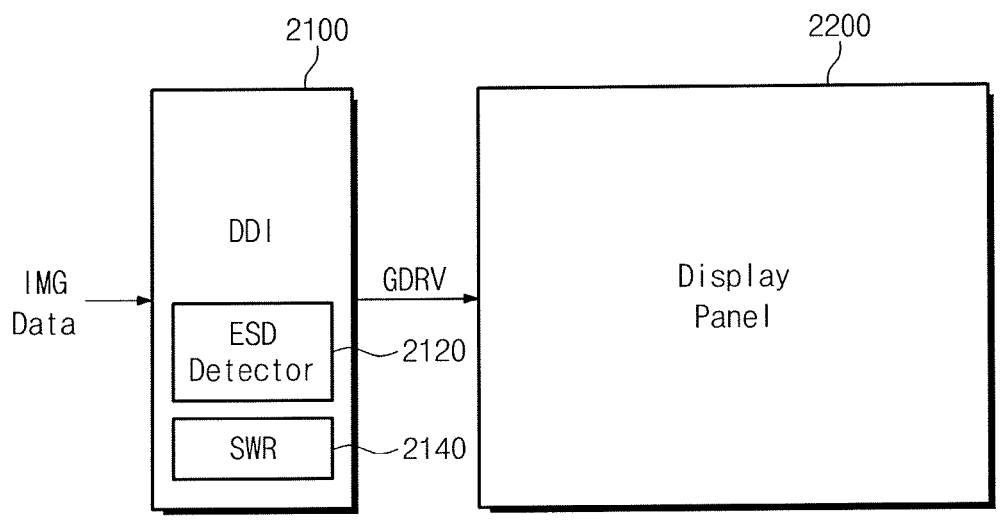
FIG. 13 is a block diagram illustrating a display device to which exemplary embodiments of the inventive concept are applied.

FIG. 13 is a block diagram illustrating a display device to which exemplary embodiments of the inventive concept are applied. Referring to FIG. 13, a display device 2000 may include a display driving IC 2100 and a display panel 2200.

The display driving IC 2100 may be configured to generate driving signals for driving gate or source drivers of the display panel 2200 based on image data IMG Data transmitted therein. Due to, for example, an increasing demand for large size, high definition, and high resolution displays (e.g., in mobile devices), complications may arise relating to timing conditions for driving signals for a display panel. For example, due to strict technical requirements for a slew rate, difficulty may arise in relation to adjusting terminal impedance of the output pad. Further, since a high voltage is used for a gate driving signal GDRV for driving the gate driver of the display panel 2200, a high voltage transistor may be used for a driver for pulling up or pulling down the output pad. In this case, in comparative examples that do not include the protection resistor according to exemplary embodiments of the inventive concept, the display device may be damaged as a result of an ESD event.

According to exemplary embodiments of the inventive concept, the display driving IC 2100 may include an ESD detector 2120 and a switch protection resistor 2140. The ESD detector 2120 may be, for example, the ESD detectors described above according to exemplary embodiments of the inventive concept. In normal operation, the switch protection resistor 2140 may be controlled by the ESD detector 2120 such that the resistance between the pad and the driver is about 0 ohms. Further, when an ESD event occurs, the switch protection resistor 2140 may be controlled by the ESD detector 2120 such that the pad and the driver are connected to each other through the protection resistor Rp. Accordingly, in normal operation, the resistance of the protection resistor Rp need not be considered, and thus, the resistance of the protection resistor Rp may be set to maximize ESD protection ability. Further, during the normal operation, the terminal impedance of the pad can be minimized, resulting in the display driving IC 2100 being capable of outputting the gate driving signal GDRV with higher reliability.

Figure 14:
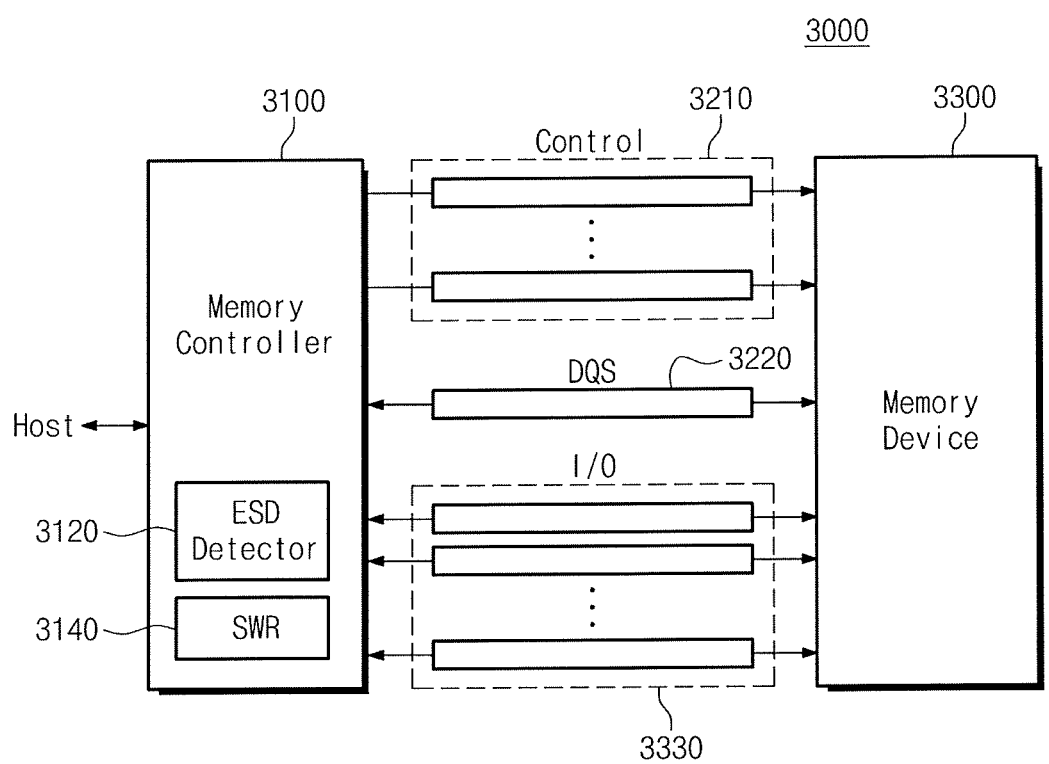
FIG. 14 is a block diagram illustrating an example of a memory device to which exemplary embodiments of the inventive concept are applied.

FIG. 14 is a block diagram illustrating an example of a memory device to which exemplary embodiments of the inventive concept are applied. Referring to FIG. 14, the memory device 3000 may include a memory controller 3100, a memory device 3300, and channels 3210, 3220, and 3330 serving as signal lines.

The memory controller 3100 may control read or write operations of the memory device 3300 in response to read/write requests from a host Host. The memory controller 3100 may be configured to exchange data with the memory device 3300 at high speed using a strobe signal (DQS signal).

The memory device 3300 may include at least one volatile or non-volatile memory chip. The memory device 3300 may exchange DQS signal and input/output data (I/O Data) with the memory controller 3100. The DQS signal may be exchanged via at least one DQS channel 3220 between the memory device 3300 and the memory controller 3100, and the I/O Data may be exchanged via data channels 3330 between the memory device 3300 and the memory controller 3100. The DQS signal may be used to provide a reference point in determining logic values of the I/O Data. In high-speed data exchanging operations, a precise reference point for determining the I/O Data may be provided through the DQS signal.

In the memory device 3000 according to exemplary embodiments of the inventive concept, the DQS signal may be used to perform data-exchanging operations at high speed. Further, the electric resistance of an output pad of the memory controller 3100 may be reduced.

The memory controller 3100 according to exemplary embodiments of the inventive concept may include an ESD detector 3120 and a switch protection resistor 3140. The ESD detector 3120 and the switch protection resistor 3140 may be the ESD detector and the switch protection resistor according to the exemplary embodiments of the inventive concept described above. In normal operation, the switch protection resistor 3140 may be controlled by the ESD detector 3120 such that the resistance between the pad and the driver is about 0 ohms. Further, when an ESD event occurs, the switch protection resistor 3140 may be controlled by the ESD detector 3120 such that the pad and the driver are connected to each other through the protection resistor Rp. Accordingly, in normal operation, the resistance of the protection resistor Rp need not be considered, and thus, the resistance of the protection resistor Rp may be set to maximize ESD protection ability. Further, in normal operation, terminal impedance of the pad can be minimized, resulting in the memory controller 3100 being capable of outputting signals with higher reliability.

By using the memory controller 3100 including the ESD detector 3120 and the switch protection resistor 3140 according to exemplary embodiments of the inventive concept, signals may be loaded to channels 3210, 3220, and 3330 with improved reliability. Accordingly, a timing condition (e.g., a slew rate) required for data transmission may be satisfied.

A method of operating the ESD circuit described above according to exemplary embodiments of the inventive concept may include detecting an AC component of a power voltage of the semiconductor device in which the ESD circuit is included, processing the AC component to generate a switch control signal that causes a resistance between a pad of the ESD circuit and a driver of the ESD circuit to increase in response to the AC component being higher than a reference value, and performing a switching operation to connect the pad to the driver through a first current path including a protection resistor in accordance with the switch control signal. The pad and the driver may be connected to each other through a second current path that does not include the protection resistor in response to the AC component being lower than the reference value.

Semiconductor devices or memory systems according to exemplary embodiments of the inventive concept can be packaged using any of various types of packages. For example, a semiconductor device according to exemplary embodiments of the inventive concept can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multichip package (MCP), wafer-level fabricated package (WFP), wafer-level processed stack package (WSP), etc.

According to exemplary embodiments of the inventive concept, an electrostatic discharge (ESD) circuit is configured to serve as a resistor for protecting a driving circuit against an ESD event, and to have a resistance level capable of meeting a time requirement for a normal operation when there is no ESD event. Accordingly, a semiconductor device including the ESD circuit can have a high quality ESD protection characteristic and effectively satisfy a timing requirement for processing signals. Further, a protection resistor level of the ESD protection circuit can be fabricated or selected with an increased design margin or an increased degree of freedom.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:
1. A semiconductor device, comprising:
   a first driver configured to pull up a voltage level of a pad to a first power voltage in response to a driving signal;
   a second driver configured to pull down the voltage level of the pad to a second power voltage in response to the driving signal;
   a switch protection resistor configured to change a resistance between the pad and the second driver in response to a switch control signal; and
   an electrostatic discharge (ESD) detector configured to detect a voltage level of the first or second power voltage and generate the switch control signal.

2. The semiconductor device of claim 1, wherein the switch protection resistor comprises:
   a protection resistor connected between the pad and the second driver; and
   a switch transistor connected in parallel to the protection resistor and forming a current path bypassing the protection resistor in accordance with the switch control signal.

3. The semiconductor device of claim 2, wherein the switch transistor comprises an n-channel metal-oxide-semiconductor (NMOS) transistor.

4. The semiconductor device of claim 2, wherein the ESD detector is configured to generate the switch control signal having a first voltage level that causes the switch transistor to turn off in response to the first power voltage being higher than a reference voltage value.

5. The semiconductor device of claim 4, wherein the ESD detector is configured to generate the switch control signal having a second voltage level that causes the switch transistor to turn on in response to the first power voltage being lower than the reference voltage value.

6. The semiconductor device of claim 2, wherein the ESD detector comprises a high pass filter configured to generate the switch control signal in response to an alternating current (AC) component of the first power voltage.

7. The semiconductor device of claim 6, wherein the ESD detector comprises:
   a resistor-capacitor (RC) circuit configured to allow the AC component of the first power voltage to pass therethrough; and
   an NMOS transistor configured to allow the switch control signal to have one of the first and second power voltages in accordance with a level of the AC component.

8. The semiconductor device of claim 2, wherein the ESD detector comprises a low pass filter configured to generate the switch control signal in response to a direct current (DC) component of the first power voltage.

9. The semiconductor device of claim 8, wherein the ESD detector comprises:
   an RC circuit configured to delay an AC component of the first power voltage for a specific duration; and
   a p-channel metal-oxide-semiconductor (PMOS) transistor and an inverter configured to pass through the switch control signal having a voltage level that causes the switch transistor to turn off for the specific duration.

10. The semiconductor device of claim 1, wherein the first driver comprises at least one PMOS transistor configured to pull up the voltage level of the pad to the first power voltage in response to the driving signal, and the second driver comprises at least one NMOS transistor configured to pull down the voltage level of the pad to the second power voltage in response to the driving signal.

11. The semiconductor device of claim 1, wherein the switch protection resistor comprises:

a protection resistor connected between the pad and a common drain shared by a PMOS transistor of the first driver and an NMOS transistor of the second driver; and a switch transistor connected in parallel to the protection resistor and forming a current path bypassing the protection resistor in accordance with the switch control signal.

12. The semiconductor device of claim 1, wherein the switch protection resistor comprises:

a first protection resistor connected to the pad;

a second protection resistor connected between the first protection resistor and the first driver; and a switch transistor connected in parallel to the first protection resistor and forming a current path bypassing the first protection resistor in accordance with the switch control signal.

13. The semiconductor device of claim 1, wherein the switch protection resistor is configured to vary a resistance property that is adjusted by the switch control signal.

14. A semiconductor device, comprising:

a driver configured to drive a pad with a first power voltage or a second power voltage in accordance with a driving signal;

a switch protection resistor configured to form one of a first current path and a second current path between the pad and the driver in accordance with a switch control signal, wherein the first current path passes through a protection resistor and the second current path bypasses the protection resistor; and an electrostatic discharge (ESD) detector configured to monitor the first or second power voltage and generate the switch control signal, wherein the first current path is formed in response to an occurrence of an ESD event.

15. The semiconductor device of claim 14, wherein the second current path is formed in response to the first or second power voltage being lower than a reference voltage value.

16. The semiconductor device of claim 14, wherein the switch protection resistor comprises:

a protection resistor connected between the pad and the driver; and a switch transistor connected in parallel to the protection resistor and forming the second current path.

17. The semiconductor device of claim 14, wherein the driver comprises:

an n-channel metal-oxide-semiconductor (NMOS) transistor configured to pull down a voltage level of the pad to the second power voltage in response to the driving signal.

18. The semiconductor device of claim 14, wherein the ESD detector comprises:

a high pass filter configured to filter an alternating current (AC) component of the first power voltage and provide the resulting filtered AC component to the switch control signal.

19. The semiconductor device of claim 14, wherein the ESD detector comprises:

a low pass filter configured to filter a direct current (DC) component of the first power voltage, invert the resulting filtered DC component, and provide the resulting inverted DC component to the switch control signal.

20. The semiconductor device of claim 14, wherein the second power voltage is a ground or a negative voltage.

* * * * *